United States Patent
Srinivasan et al.

[11] Patent Number: 6,137,707
[45] Date of Patent: Oct. 24, 2000

[54] METHOD AND APPARATUS FOR SIMULTANEOUSLY PERFORMING A PLURALITY OF COMPARE OPERATIONS IN CONTENT ADDRESSABLE MEMORY DEVICE

[75] Inventors: Varadarajan Srinivasan, Los Altos Hills; Sandeep Khanna, Santa Clara; Bindiganavale S. Nataraj, Cupertino, all of Calif.

[73] Assignee: NetLogic Microsystems, Mountain View, Calif.

[21] Appl. No.: 09/276,885

[22] Filed: Mar. 26, 1999

[51] Int. Cl.[7] ................................................. G11C 15/02
[52] U.S. Cl. .................. 365/49; 365/189.07; 365/230.04
[58] Field of Search .......................... 365/49, 52, 189.07, 365/230.06, 230.04

[56] References Cited

U.S. PATENT DOCUMENTS

| | | | |
|---|---|---|---|
| 3,257,646 | 6/1966 | Roth | 340/172.5 |
| 3,353,159 | 11/1967 | Lee, III | 340/172.5 |
| 3,602,899 | 8/1971 | Lindquist et al. | 340/0 |
| 3,675,211 | 7/1972 | Raviv | 340/172.5 |
| 3,685,020 | 8/1972 | Meade | 340/172.5 |
| 3,868,642 | 2/1975 | Sachs | 340/172.5 |

(List continued on next page.)

FOREIGN PATENT DOCUMENTS

| | | |
|---|---|---|
| 0 660 332 | 12/1993 | European Pat. Off. . |
| 04021997 | 1/1992 | Japan . |
| 08167295 | 6/1996 | Japan . |

OTHER PUBLICATIONS

Music Semiconductors, "MU9C2480 LANCAM Preliminary Data Sheet", Aug. 25, 1995, pp. 1–24.

GEC Plessey Semiconductors Preliminary Information, "2800 2K×64 Bit Multi–Port Content Addressable Memory", Feb. 1997, pp. 1–15.

(List continued on next page.)

*Primary Examiner*—David Nelms
*Assistant Examiner*—Thong Le
*Attorney, Agent, or Firm*—Blakely, Sokoloff, Taylor & Zafman

[57] ABSTRACT

A method and apparatus for simultaneously performing a plurality compare operations in a content addressable memory (CAM) device. For one embodiment, the CAM device includes a CAM array having a plurality of CAM cells, a first comparand register for storing first comparand data, and a second comparand register for storing second comparand data. Each CAM cell receives the first comparand data over a first set of compare lines, and receives the second comparand data over a second set of compare lines. Each CAM cell has a memory cell and multiple compare circuits that can individually and simultaneously compare the first and second comparand data with data stored in the memory cell. The result of each comparison is reflected on a corresponding match line. The match lines are then selectively coupled to a priority encoder to determine a match address corresponding to each compare operation. For one embodiment, the CAM cells may be ternary CAM cells each having a mask cell.

40 Claims, 8 Drawing Sheets

U.S. PATENT DOCUMENTS

| | | | |
|---|---|---|---|
| 4,112,502 | 9/1978 | Scheuneman | 364/900 |
| 4,244,033 | 1/1981 | Hattori | 364/900 |
| 4,472,805 | 9/1984 | Wacyk et al. | 371/51 |
| 4,523,301 | 6/1985 | Kadota et al. | 365/49 |
| 4,646,271 | 2/1987 | Uchiyama et al. | 365/49 |
| 4,656,626 | 4/1987 | Yudichak et al. | 370/68 |
| 4,670,858 | 6/1987 | Almy | 365/49 |
| 4,747,080 | 5/1988 | Yamada | 365/200 |
| 4,758,982 | 7/1988 | Price | 364/900 |
| 4,780,845 | 10/1988 | Threewitt | 365/49 |
| 4,785,398 | 11/1988 | Joyce et al. | 364/200 |
| 4,791,606 | 12/1988 | Threewitt et al. | 364/49 |
| 4,813,002 | 3/1989 | Joyce et al. | 364/49 |
| 4,845,668 | 7/1989 | Sano et al. | 365/49 |
| 4,903,234 | 2/1990 | Sakuraba et al. | 365/49 |
| 4,928,260 | 5/1990 | Chuang et al. | 365/49 |
| 4,958,377 | 9/1990 | Takahashi | 382/34 |
| 4,959,811 | 9/1990 | Szczepanek | 365/49 |
| 4,975,873 | 12/1990 | Nakabayashi et al. | 365/49 |
| 4,996,666 | 2/1991 | Duluk, Jr. | 365/49 |
| 5,010,516 | 4/1991 | Oates | 365/49 |
| 5,014,195 | 5/1991 | Farrell et al. | 364/200 |
| 5,036,486 | 7/1991 | Noguchi et al. | 365/49 |
| 5,051,948 | 9/1991 | Watabe et al. | 365/49 |
| 5,053,991 | 10/1991 | Burrows | 365/49 |
| 5,107,501 | 4/1992 | Zorian | 371/213 |
| 5,111,427 | 5/1992 | Kobayashi et al. | 365/49 |
| 5,226,005 | 7/1993 | Lee et al. | 365/49 |
| 5,265,100 | 11/1993 | McClure et al. | 371/21.2 |
| 5,319,589 | 6/1994 | Yamagata et al. | 365/49 |
| 5,319,590 | 6/1994 | Montoye | 365/49 |
| 5,383,146 | 1/1995 | Threewitt | 365/49 |
| 5,414,704 | 5/1995 | Spinney | 370/60 |
| 5,440,709 | 8/1995 | Edgar | 395/401 |
| 5,446,685 | 8/1995 | Holst | 365/49 |
| 5,454,094 | 9/1995 | Montoye | 395/435 |
| 5,455,576 | 10/1995 | Clark, II et al. | 341/50 |
| 5,469,161 | 11/1995 | Bezek | 341/51 |
| 5,485,418 | 1/1996 | Hiraki et al. | 365/49 |
| 5,490,102 | 2/1996 | Jubran | 365/49 |
| 5,491,703 | 2/1996 | Barnaby et al. | 371/40.1 |
| 5,513,134 | 4/1996 | Cooperman et al. | 365/49 |
| 5,517,441 | 5/1996 | Dietz et al. | 365/49 |
| 5,598,115 | 1/1997 | Holst | 326/119 |
| 5,642,114 | 6/1997 | Komoto et al. | 341/67 |
| 5,696,449 | 12/1997 | Atallah et al. | 365/49 |
| 5,706,224 | 1/1998 | Srinivasan | 365/49 |
| 5,859,791 | 1/1999 | Schultz et al. | 365/49 |
| 5,870,324 | 2/1999 | Helwig et al. | 365/49 |
| 5,933,363 | 8/1999 | Shindo | 365/49 |
| 5,940,852 | 8/1999 | Rangasayee et al. | 711/108 |
| 6,044,005 | 3/2000 | Gibson et al. | 365/49 |

OTHER PUBLICATIONS

Music Semiconductor, "The MU9C1480 LANCAM Handbook", Rev. 3, Nov. 1994, pp. 1–1 through 7–12.

Music Semiconductors, "MU9C1480 LANCAM" Advanced Information, Mar. 22, 1990, pp. 1–11.

KLSI, "Address Processor", KE5B064H series–Dual Port and Fixed Table Type–, Version 1.0.1, published approximately late 1995 or early 1996, pp. 1–1 through 14–1.

KLSI, "KE5B064A1 Addressable Processor", Version 2.0.2, published approximately late 1995 or early 1996, pp. 1–1 through 12–1.

Music Semiconductors, "MUAA™ CAM Family" Advanced Information, Feb. 24, 1998, Rev. O, pp. 1–16.

Soo–Ik Chae et al., "Content–Addressable Memory for VLSI Pattern Inspection", IEEE Journal of Solid State Circuits, vol. 23, No. 1, Feb. 1998, pp. 74–78.

Yong–Chul Shin et al., "A Special–Purpose Content Addressable Memory Chip for Real–Time Image Processing", IEEE Journal of Solid–State Circuits, vol. 27, No. 5, May 1992, pp. 737–744.

Sergio R. Ramirez–Chavez, "Encoding Don't Cares in Static and Dynamic Content–Addressable Memories", Transaction Briefs, IEEE Transactions on Circuits and System–II: Analog and Digital Signal Processing, vol. 39, No. 8, Aug. 1992, pp. 575–578.

Ian N. Robinson, Hewlett–Packard Laboratories, "Pattern–Addressable Memory", Jun. 1992, pp. 20–30.

Keikichi Tamaru, "The Trend of Functional Memory Development", Invited Paper Special Issue on LSI Memories, IEICE Trans. Electron., vol. E76–C, No. 11, Nov. 1993, pp. 1545–1554.

Takeshi Ogura et al., "A 4–kbit Associative Memory LSI", IEEE Journal of solid–State Circuites, vol. SC–20, No. 6, Dec. 1985, pp. 1277–1281.

Hiroshi kadota et al., "An 8–kbit Content–Addressable and Reentrant Memory", IEEE Journal of Solid–State Circuts, vol. SC–20, No. 5, Oct. 1985, pp. 951–956.

Simon R. Jones et al., "A 9–kbit Associative Memory for High–speed Parallel Processing Applications", IEEE Journal of Solid–State Circuits, vol. 23, No. 2, Apr. 1988m pp. 543–548.

Anthony J. McAuley et al., "A Self–Testing Reconfigurable CAM", IEEE Journal of Solid–State Circuits, vol. 26, No. 3, Mar. 1991, pp. 257–261.

Landrock et al., "Associative Storage Module", IBM Technical Disclosure Bulletin, vol. 25, No. 5, Oct. 1982, pp. 2341–2342.

Masao Akata, "A Scheduling Content–Addressable Memory for ATM Space–Division Switch Control", IEEE International Solid State Circuits Conference, Feb. 1991, New York.

Ghose et al., "Response Pipelined CAM Chips: The First Generation and Beyond", $7^{th}$ International conference on VLSI Design, Jan. 1994, pp. 365–368.

METHOD AND APPARATUS FOR SIMULTANEOUSLY PERFORMING A PLURALITY OF COMPARE OPERATIONS IN CONTENT ADDRESSABLE MEMORY DEVICE

FIELD OF THE INVENTION

The present invention relates generally to content addressable memory (CAM) devices, and more particularly to a method and apparatus for simultaneously performing a plurality of compare operations in a CAM device.

BACKGROUND

A content addressable memory (CAM) device is a storage device that can be instructed to compare a specific pattern of comparand data with data stored in its associative CAM array. The entire CAM array, or segments thereof, are searched in parallel for a match with the comparand data. The CAM device typically indicates if a match occurs by asserting a match flag, and also typically indicates if multiple matches occur by asserting a multiple match flag. The CAM device can then be instructed to output the highest priority match address or index, data stored in one or more CAM cells at the matching address, and other status information including the match flags, a full flag, validity bits (e.g., skip and empty bits), and other status information.

CAM devices require a particular amount of time to perform a compare operation. This time includes the time to load and decode the compare instruction, the time to provide the comparand data to the CAM array, the time to perform the comparison operation within the CAM array, and the time to determine the highest priority matching location. Typical compare operation times range from approximately 25 ns (40 MHz) up to 125 to 300 ns. Compare operations have a direct correlation to search rates for the CAM device. It is generally desirable to increase the search rate of a CAM device so to increase the overall throughput of a system incorporating the CAM device.

Pipelining compare instructions to a particular CAM device has been used to increase the throughput of that CAM device. By pipelining compare instructions, the CAM device can run at its maximum sustained search rate over multiple periods of time. For example, if a CAM device can run at 40 MHz and perform one search per clock cycle (i.e., 40 MS/s or 40 million searches per second), then pipelining of the compare instruction will enable the CAM device to further increase the search rate at the expense of an initial cycle latency.

FIGS. 1 and 2 show another technique for increasing the search rate of a CAM device. In FIG. 1, a single CAM device has been replaced with a CAM system 100 that includes multiple CAM devices 107–110 that can increase the sustained search rate of CAM system 100 to approximately four times over that of a single CAM device (e.g., CAM device 107). For example, as shown in FIG. 2, if CAM device 107 has an individual maximum sustained search rate of 40 MS/s, then system 100 can increase the sustained search rate of system 100 to 160 MS/s. This is accomplished at the expense of adding three redundant CAM devices 108–110 each storing a redundant set of data, and by providing separate comparand data to each CAM device in successive clock cycles. As shown in FIG. 2, CAM device 107 will receive a first compare instruction (CMP1) and first comparand data during a first system clock cycle, CAM device 108 will receive a second compare instruction (CMP2) and second comparand data during a second system clock cycle, CAM device 109 will receive a third compare instruction (CMP3) and third comparand data during a third system clock cycle, and CAM device 110 will receive a fourth compare instruction (CMP4) and fourth comparand data during a fourth system clock cycle. While the system clock runs at 160 MHz, each individual CAM device runs at 40 MHz and typically receives a 40 MHz clock signal in addition to the 160 MHz system clock (or a logical combination of the two clocks).

As each CAM device has an individual search rate of 40 MS/s, each CAM device will output to OBUS 104 the matching address of any matching location in its CAM array approximately five cycles after receiving its compare instruction and comparand data. Thus, after an initial lag period of approximately 25 ns, the sustained search rate will be approximately 160 MS/s starting at cycle T4. This increased sustained search rate, however, is achieved at the expense of adding three redundant CAM device 108–110 and control logic (not shown) necessary to ensure that each CAM device is selected in at the appropriate time to receive the instruction and comparand data. The redundant CAM devices each store a duplicate of the data stored in CAM device 107 which results in increased table management by control logic in which system 100 is incorporated.

It would be advantageous to increase the sustained search rate of a CAM device without significantly increasing the table management tasks of a system, and without adding additional redundant (CAM devices.

SUMMARY OF THE INVENTION

A method and apparatus for simultaneously performing a plurality of compare operations in a content addressable memory (CAM) device is disclosed. For one embodiment, the CAM device includes a CAM array having a plurality of CAM cells, a first comparand register for storing first comparand data, and a second comparand register for storing second comparand data. Each CAM cell receives the first comparand data over a first set of compare lines, and receives the second comparand data over a second set of compare lines. Each CAM cell has a memory cell and multiple compare circuits that can together simultaneously compare the first and second comparand data with data stored in the memory cell. The result of each comparison is reflected on a corresponding match line. The match lines are then selectively coupled to a priority encoder to determine a match address corresponding to each compare operation. For one embodiment, the CAM cells may be ternary CAM cells each having a mask cell.

Other objects, features, and advantages of the present invention will be apparent from the accompanying drawings and from the detailed description, which follows below.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be single signal lines, and each of the single signal lines may alternatively be buses. Additionally, the prefix symbol "/" or the suffix "B" attached to signal names indicate that the signal is an active low signal. Each of the active low signals may be changed to active high signals as generally known in the art.

A method and apparatus for simultaneously performing a plurality of compare operations in a content addressable memory (CAM) device is disclosed. For one embodiment, as will be described in greater detail below, the CAM device includes a CAM array having a plurality of CAM cells, a first comparand register for storing first comparand data, and a second comparand register for storing second comparand data. Each CAM cell receives the first comparand data over a first set of compare lines, and receives the second comparand data over a second set of compare lines. Each CAM cell has a memory cell and multiple compare circuits that can together simultaneously compare the first and second comparand data with data stored in the memory cell. The result of each comparison is reflected on a corresponding match line. The match lines are then selectively coupled to a priority encoder to determine a match address corresponding to each compare operation. For one embodiment, the CAM cells may be ternary CAM cells each having a mask cell.

The present CAM device advantageously enables a single CAM device to have an increased sustained search rate over conventional single CAM devices. This is accomplished without using redundant CAM devices that can cause significant increases in the cost of a system and in overhead due to table management. For one embodiment, a single CAM device according to the present invention can have a sustained search rate of approximately 160 MS/s, 200 MS/s, or higher (or lower) search rates.

Figure 1:
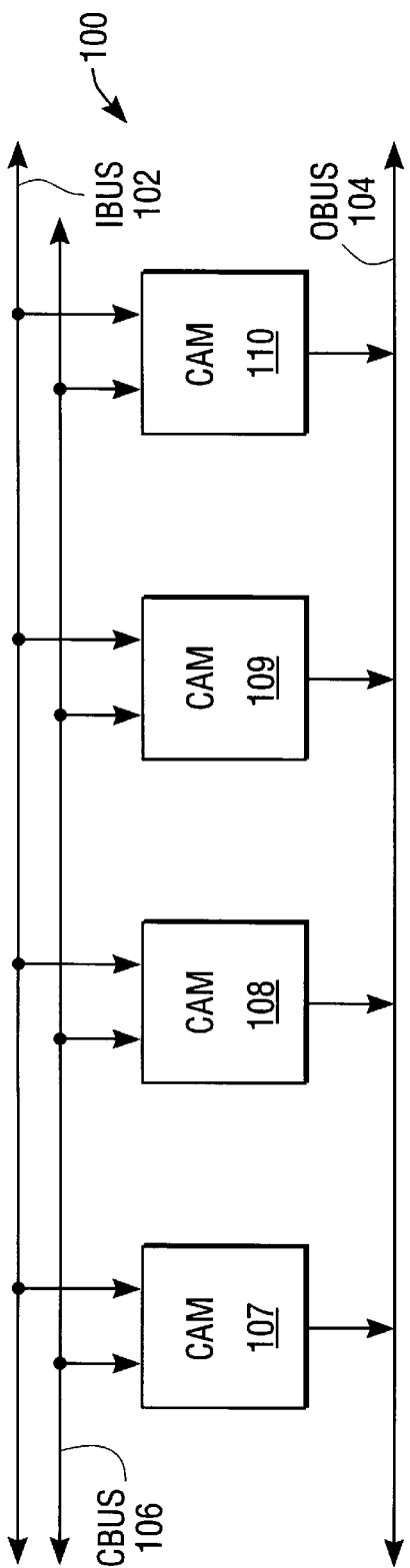
FIG. 1 is a block diagram of a prior CAM system having a plurality of CAM devices each storing the same table.
Figure 2:
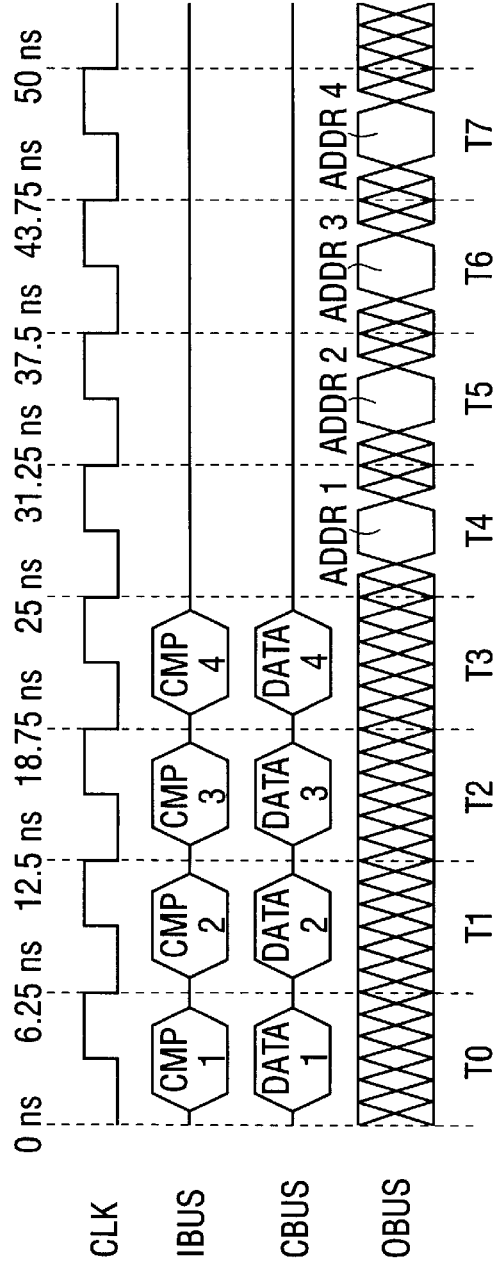
FIG. 2 is timing diagram illustrating the operation of the system of FIG. 1.
Figure 3:
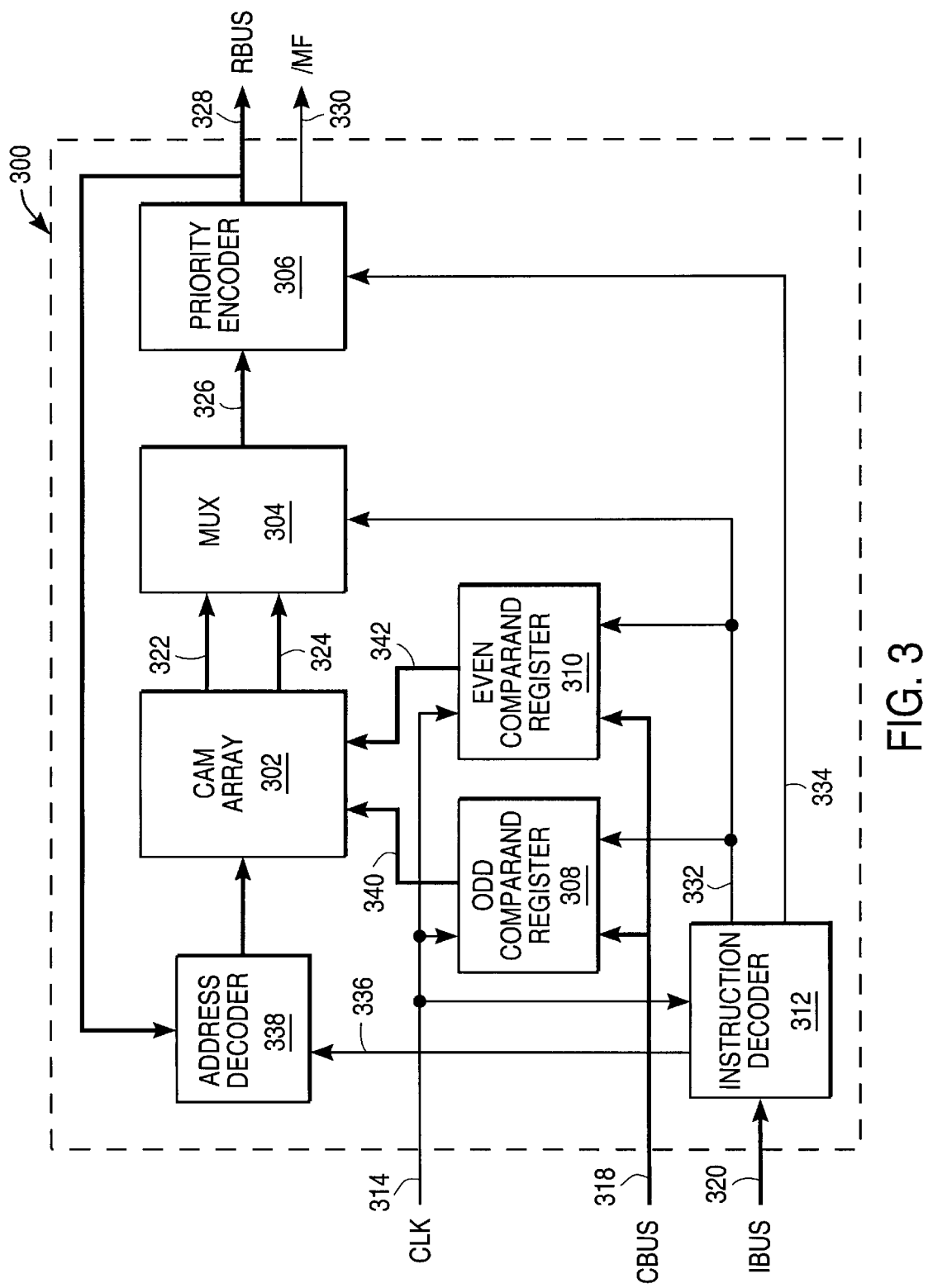
FIG. 3 is a block diagram of one embodiment of a CAM device for simultaneously performing multiple compare operations.

FIG. 3 shows a CAM device 100 that is one embodiment of a CAM device that can perform simultaneous compare operations. CAM device 300 may be a stand-alone CAM device, or may be a CAM device that is incorporated into a larger integrated circuit. CAM device 300 is a synchronous CAM device that performs its operations in response to an external clock signal CLK on line 314. It will be appreciated, however, that alternative embodiments of the present invention may be implemented in asynchronous CAM devices.

CAM device 300 includes an instruction bus IBUS 320 for receiving instructions, a separate comparand bus CBIJS 318 for receiving comparand data to be compared with one or more CAM cells of CAM array 302, and a separate output bus RBUS 328 for outputting a matching CAM index or address of CAM array 302. For an alternative embodiment, one or more of buses 318, 320, and 328 may be shared or time multiplexed.

CAM device 300 also includes CAM array 302 that has a plurality of CAM cells that store data to be compared with comparand data provided from odd comparand register 308, even comparand register 310, or directly from comparand bus CBUS 318. The comparison results are reflected on even match lines 322 and odd match lines 324 and provided to multiplexer 304. Multiplexer 304 provides either the odd match lines or even match lines to priority encoder 306, and priority encoder 306 outputs a matching address on RBUS 328 and drives match flag/MF on line 330.

Figure 4:
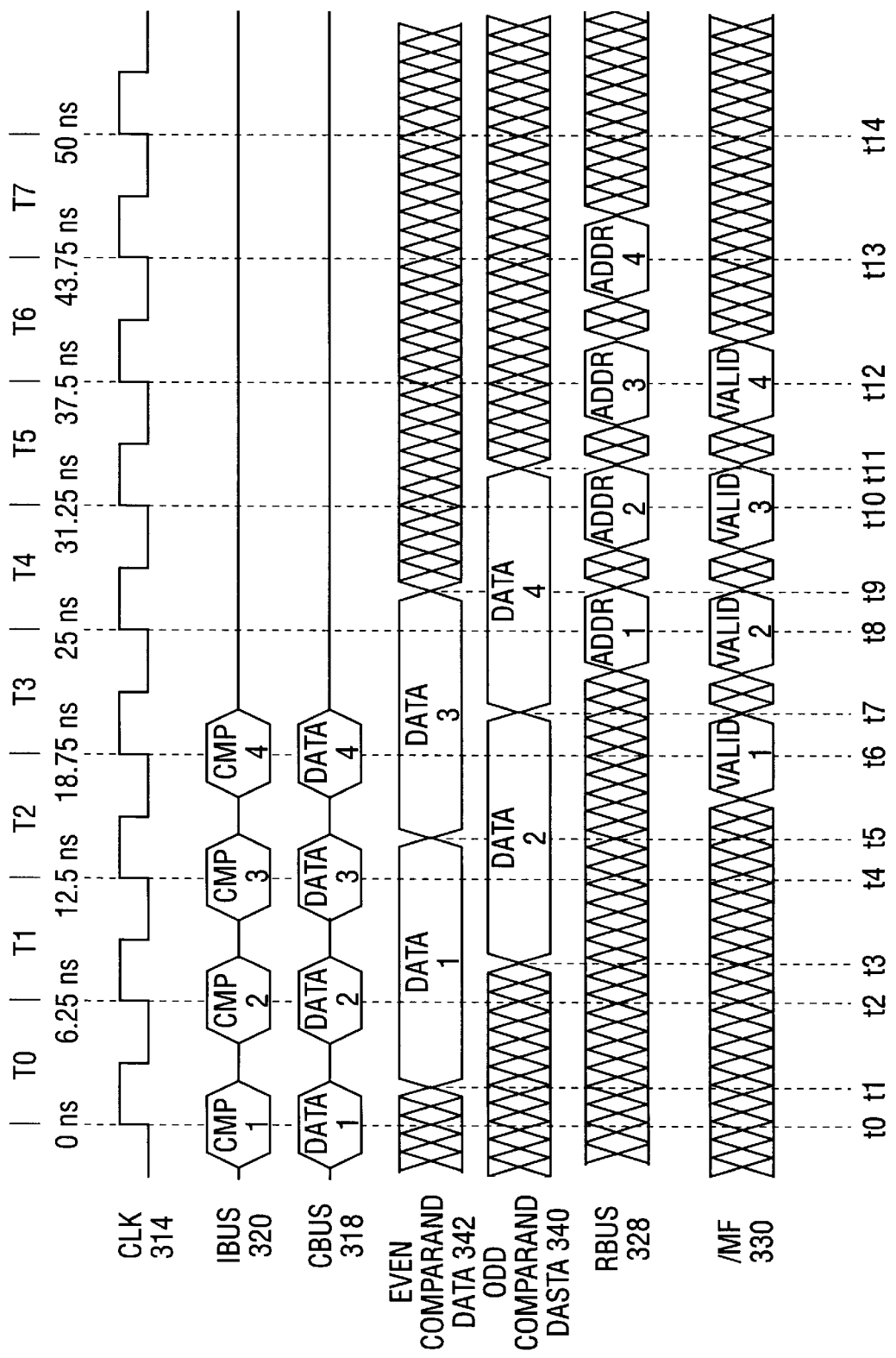
FIG. 4 is a timing diagram illustrating one embodiment of the operation of the CAM device of FIG. 3 simultaneously performing multiple compare operations on the same CAM array.

CAM device 300 can perform multiple interleaved or overlapped compare operations to increase its sustained search rate. For example, as shown in FIG. 4, if CAM device 300 can perform a single compare instruction in approximately 12.5 ns (80 MHz), then CAM device 300 can perform multiple interleaved compare operations to increase the sustained search rate from 80 MS/s to approximately 160 MS/s as follows. At time t0, a first compare instruction (CMP1) is provided to instruction decoder 312 over IBUS 320 together with first comparand data on CBUS 318. Instruction decoder 312 decodes the instruction and causes (e.g., by a signal on line 332) even comparand register 310 to load the first comparand data. Subsequently (e.g., at approximately times t1–t5), even comparand register 310 outputs the first comparand data on bus 342 for comparison with the data stored in CAM array 302. The comparison results are reflected on even match lines 322 and provided to multiplexer 304. Each CAM cell in CAM array 302 is coupled to one of even match lines 322.

At time t2, a second comparison instruction (CMP2) is provided to instruction decoder 312 together with second comparand data on CBUS 318. Instruction decoder 312 decodes the instruction and causes (e.g., by a signal on line 332) odd comparand register 308 to load the second comparand data. Subsequently (e.g., at approximately times t3–t7), odd comparand register 308 outputs the second comparand data on bus 340 for comparison with the data stored in CAM array 302. The comparison results are reflected on odd match lines 324 and provided to multiplexer 304. Each CAM cell in CAM array 302 is coupled to one of odd match lines 324.

As shown in FIG. 4, there is a time (e.g., time t3–t5) in which the first (even) comparand data is provided to CAM array 302 at the same time that the second (odd) comparand data is provided to CAM array 302. During this time, CAM array 302 simultaneously compares tLe first and second comparand data with its stored data. These comparison results are reflected on even match lines 322 and odd match lines 324.

When the first comparison results are ready, instruction decoder 312 causes multiplexer 304 to select the even match lines to be provided to priority encoder 306 over bus 326. Instruction decoder 312 may do this by sending one or more signals on signal line 332, or by sending one or more signals to logic (not shown) that controls the selection. Priority encoder 306 then determines the highest priority matching location in CAM array that stores data matching the first comparand data, and outputs the address of the highest priority matching location to RBUS 328 by time t8. Alternatively, priority encoder 306 may determine any other priority matching address. For another embodiment, the address of the highest priority matching location may be output to RBUS 328 by time t6. Priority encoder 306 may also determine the state of/MF by time t6 (or by a later time) for the first comparison. Alternatively, separate flag logic may make this determination.

The first match address may optionally be fed back to address decoder 338 to locate the address and read data stored in CAM array at the matching address. This data may be output from CAM device 300 together with the first matching address or at any other predetermined time.

When the second comparison results are ready, instruction decoder 312 causes multiplexer 304 to select the odd match lines to be provided to priority encoder 306 over bus 326. Instruction decoder 312 may do this by sending one or more signals on signal line 332, or by sending one or more signals to logic (not shown) that controls the selection. Priority encoder 306 then determines the highest priority matching location in CAM array that stores data matching the second comparand data, and outputs the address of the highest priority matching location to RBUS 328 by time t10. Alternatively, priority encoder 306 may determine any other priority matching address. For another embodiment, the address of the highest priority matching location may be output to RBUS 328 by time t8 (when the highest priority matching location of the first compare operation is output by time t6). Priority encoder 306 may also determine the state of/MF for the second comparison by time t8 (or by a later time). Alternatively, separate flag logic may make this determination. The match flag results for the second comparison may be output to the same match flag signal line 330, or they may be output to a second independent signal line.

The second match address may also be optionally fed back to address decoder 338 to locate the address and read data stored in CAM array at the matching address. This data may be output from CAM device 300 together with the second matching address or at any other predetermined time.

Similarly, third and fourth compare operations and their corresponding comparand data can be loaded into CAM device 300 as shown in FIG. 4 such that a new compare operation is loaded every clock cycle, and corresponding matching address or index for that operation is output as valid data after two clock cycles (i.e., in cycles T5 and T6, respectively). As shown in FIG. 4, the third compare operation overlaps the second compare operation, and the fourth compare operation overlaps the third compare operation. While there is an initial time lag of approximately 25 ns to obtain the first search results on RBUS 328, CAM device 300 has a sustained search rate of approximately 160 MS/s over cycles T3–T6.

The internal operation of CAM device 300 and the existence of multiple comparand registers may be transparent to the user of CAM device 300. The user simply knows that CAM device 300 can function with a 160 MHz input clock and provide a sustained search rate of approximately 160 MS/s.

For an alternative embodiment of CA,M device 300, multiplexer 300 may be omitted and separate priority encoders may be used to resolve the odd and even match lines. The output of each priority encoder may then multiplexed onto RBUS 328, or may be output to separate RBUSes.

CAM device 300 can be extended to include any number of additional comparand registers and additional sets of match lines to accommodate even higher sustained search rates. For example, CAM device 300 can interleave and simultaneously perform three compare operations when a third comparand register is added, CAM array 302 is modified to include a third match line coupled to each CAM cell, and a third plurality of match lines is provided to multiplexer 304.

Additionally, while the example of FIG. 4 shows specific timing, search rates, and frequencies, it will be appreciated that CAM device 300 can be operated at any frequency to accommodate any search rate.

For another embodiment, two separate CBUSes may be used to provide comparand data to comparand registers 308, and 310. In this embodiment, two comparand data can be simultaneously provided to CAM array 302 for simultaneous comparison with data stored in the array. The simultaneous comparison can be performed completely in parallel in time (vs. interleaved), or may be interleaved. The results of the simultaneous comparison can be simultaneously output via the match lines to multiple RBUSes, or can be time-multiplexed on a single RBUS.

Figure 5:
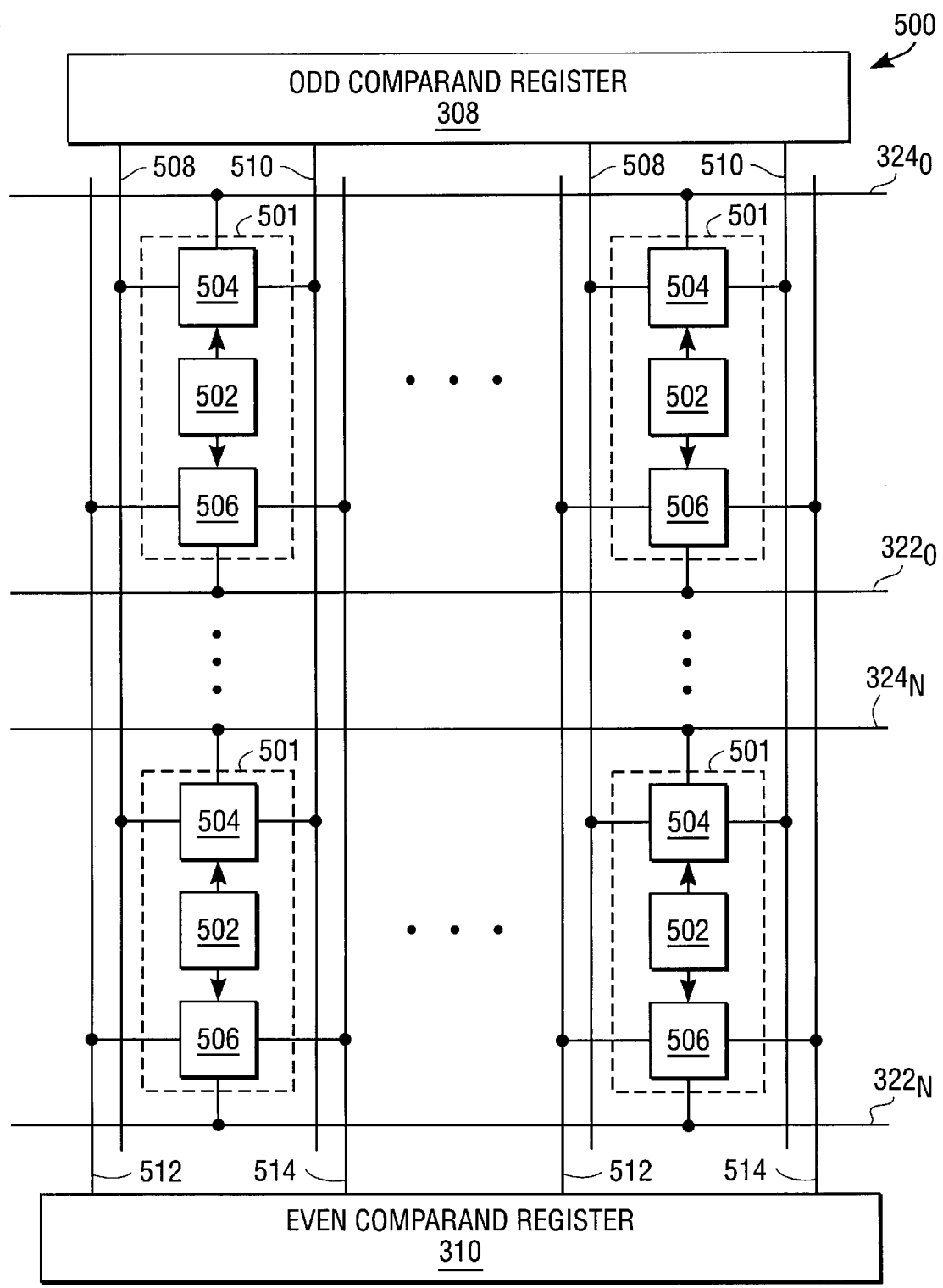
FIG. 5 is one embodiment of a CAM array of the CAM device of FIG. 3.

FIG. 5 shows CAM array 500 that is one embodiment of CAM array 302. CAM array 500 includes a plurality of CAM cells 501 that each include a memory cell 502 and two compare circuits 504 and 506. Word lines and data bit lines for providing data to and from the memory cells has been omitted so as not to obscure the Figure.

Memory cell 502 may be any type of volatile or non-volatile memory cell. Odd compare circuits 504 may be any type of compare circuits that can compare the data stored in memory cell 502 with the odd comparand data provided to odd compare lines 508 and 510 from odd comparand register 308. The comparison result is reflected on odd match lines $324_0$–$324_N$. Similarly, even circuits 506 may be any type of compare circuits that can compare the data stored in memory cell 502 with the even comparand data provided to even compare lines 512 and 514 from even comparand register 310. The comparison result is reflected on even match lines $322_0$–$322_N$.

The odd compare lines 508 and 510 may carry complementary data. Similarly, the even compare lines 512 and 514 may carry complementary data. In alternative embodiments, there may be only a single odd or even compare line.

As each CAM cell 501 includes two compare circuits each coupled to their own match line, each CAM cell is capable of simultaneously performing two comparison operations on the data stored in the memory cells. That is, odd compare circuits 504 can compare the data from odd comparand register 308 with the data in memory cell 502 at the same time that even compare circuit 506 can compare data from even comparand register 310 with the data in memory cell 502. This will increase the overall sustained search rate of CAM array 500.

Each CAM cell 501 can be extended to perform as many simultaneous compare operations as are required by a CAM device incorporating CAM array 500 by including additional compare circuits, compare lines, and match lines. For example, three simultaneous compare operations can be performed by adding a third match line coupled to a third compare circuit in each CAM cell 501. The third compare circuit receives third comparand data from a third set of compare lines that may be driven by a third comparand register.

Figure 6:
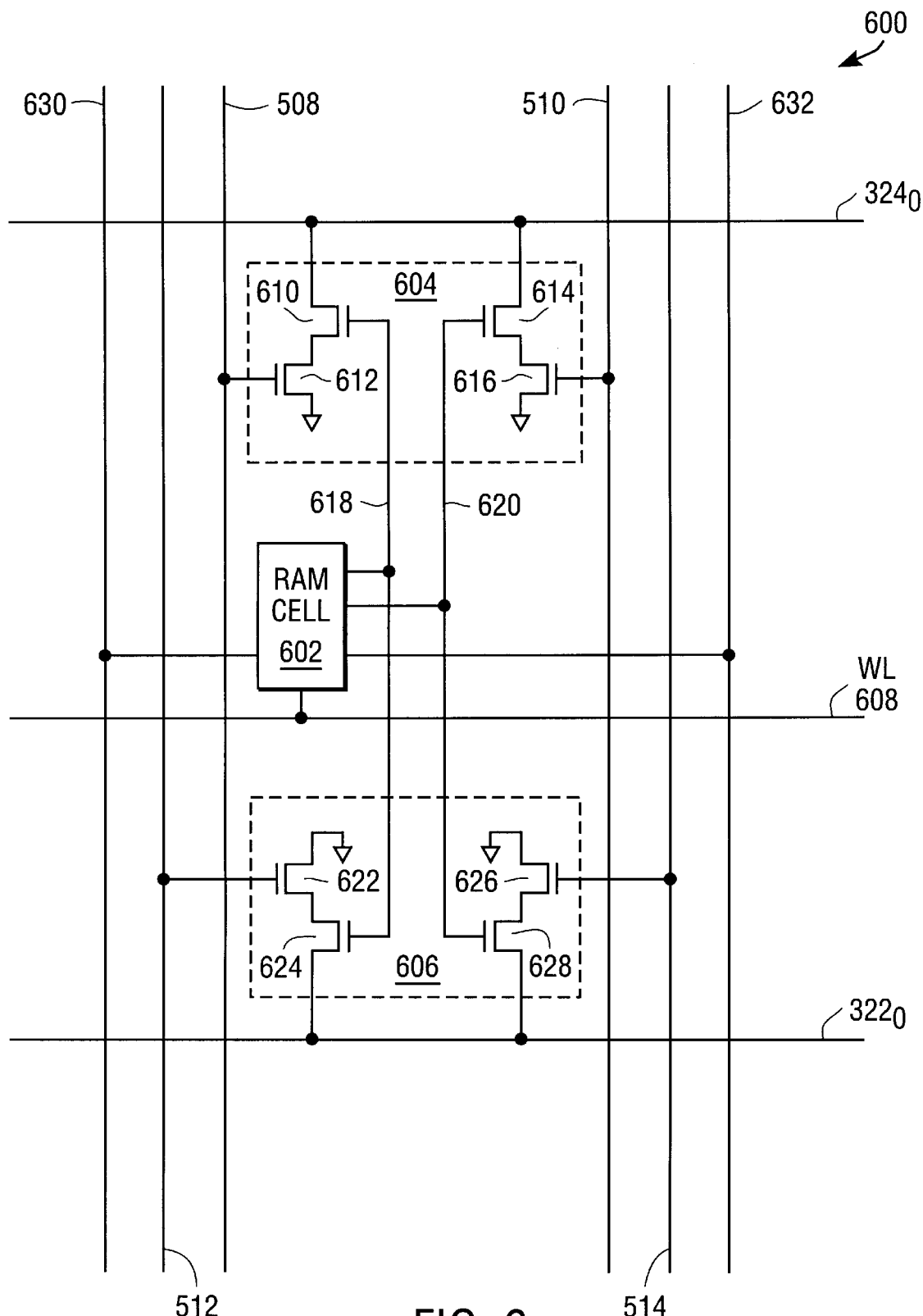
FIG. 6 is one embodiment of a CAM cell of the CAM array of FIG. 5.

While any memory cell and compare circuits may be used for CAM cell 501 of FIG. 5, FIG. 6 shows a CAM cell 600 that is one embodiment of CAM cell 501 of FIG. 5. CAM cell 600 includes random access memory (RAM) cell 602 that is one embodiment of memory cell 502, odd compare circuit 604 that is one embodiment of odd compare circuit 504, and even compare circuit 606 that is one embodiment of even compare circuit 506.

RAM cell 602 is a bi-stable latch that stores data and its logical complement. Data can be written to and read from RAM cell 602 via one or more of complementary data bit lines 630 and 632 when RAM cell 602 is accessed by wordline 608. The data stored in RAM cell 602 is provided to compare circuits 604 and 606 over signal lines 618 and 620. Odd compare circuit 604 includes transistors 610, 612, 614, and 616. Transistor 610 has its drain coupled to match line $324_0$, its gate coupled to line 618, and its source coupled to the drain of transistor 612. Transistor 612 has its gate coupled to compare line 508, and its source coupled to ground. Transistor 614 has its drain coupled to match line $324_0$, its gate coupled to line 620, and its source coupled to the drain of transistor 616. Transistor 616 has its gate coupled to compare line 510, and its source coupled to ground.

Even compare circuit 606 includes transistors 622, 624, 626, and 628. Transistor 624 has its drain coupled to match line $322_0$, its gate coupled to line 618, and its source coupled to the drain of transistor 622. Transistor 622 has its gate coupled to compare line 512, and its source coupled to ground. Transistor 628 has its drain coupled to match line $322_0$, its gate coupled to line 620, and its source coupled to the drain of transistor 626. Transistor 626 has its gate coupled to compare line 514, and its source coupled to ground.

CAM array 500 of FIG. 5 may also be a ternary or mask-per-bit CAM array that includes ternary CAM cells. A ternary CAM cell is one that can effectively store three states of information, namely: a logic one state, a logic zero state, and a don't care state for search or compare operations. In a ternary CAM array, each CAM cell includes a mask cell that stores data indicating whether data stored in that CAM cell is masked from comparison operations. A mask cell can be included in CAM cell 501 of FIG. 5 and/or CAM cell 600 of FIG. 6 to perform this function.

Figure 7:
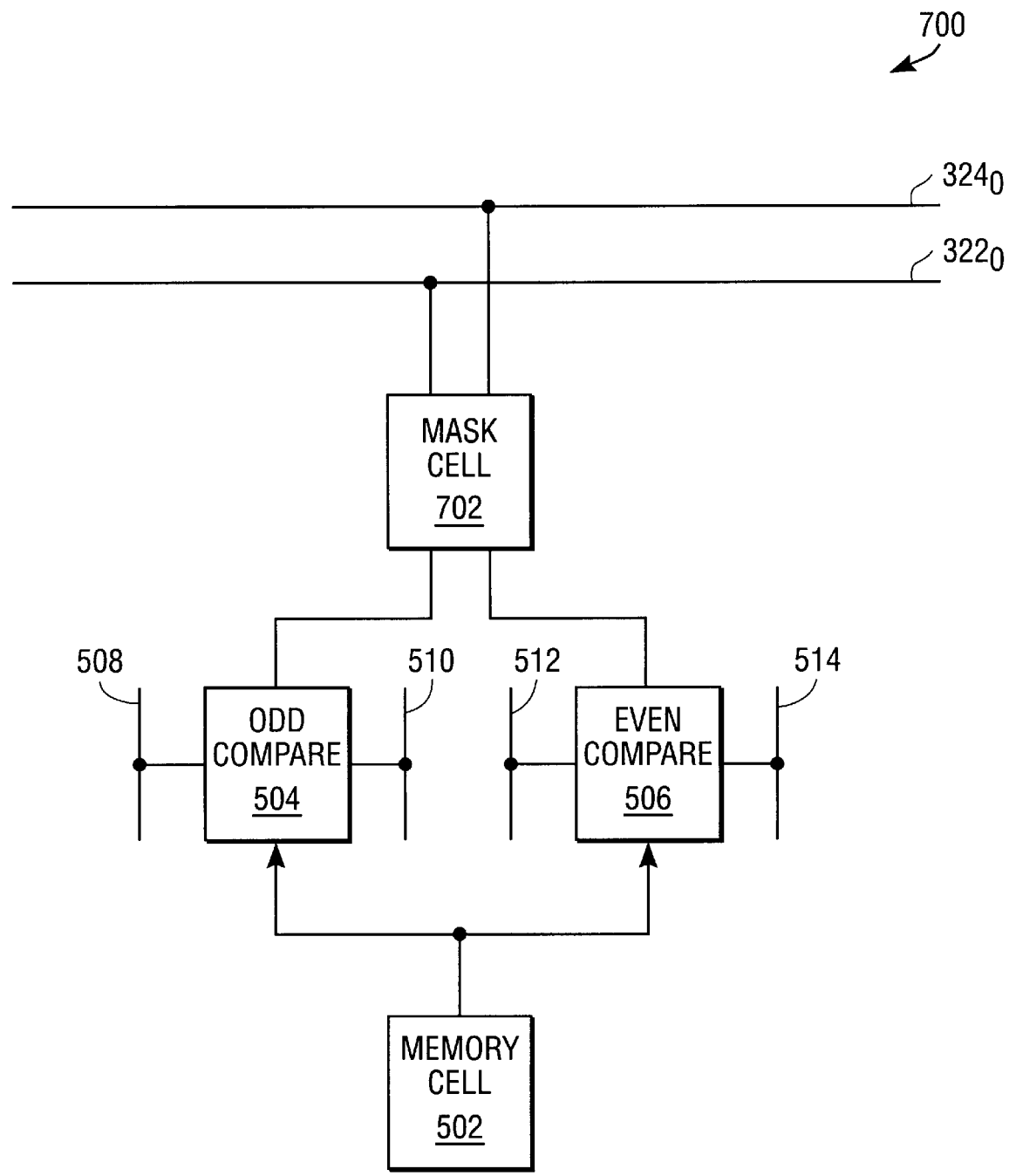
FIG. 7 is one embodiment of ternary CAM cell capable of simultaneously performing multiple compare operations.

FIG. 7 shows ternary CAM cell 700 that is one embodiment of CAM cell 500 of FIG. 5 configured as a ternary CAM cell. CAM cell 700 includes mask cell 702 that masks the comparison results generated by both of the compare circuits 504 and 506. For alternative embodiment a separate mask cell may be provided for each compare circuit. Mask cell 702 may be any well-known mask cell that includes, for example, a memory storage element for storing the mask data, and a masking circuit for masking the comparison results. Mask data may be loaded into and read from mask cell 702 via a wordline and data bitlines not shown.

Figure 8:
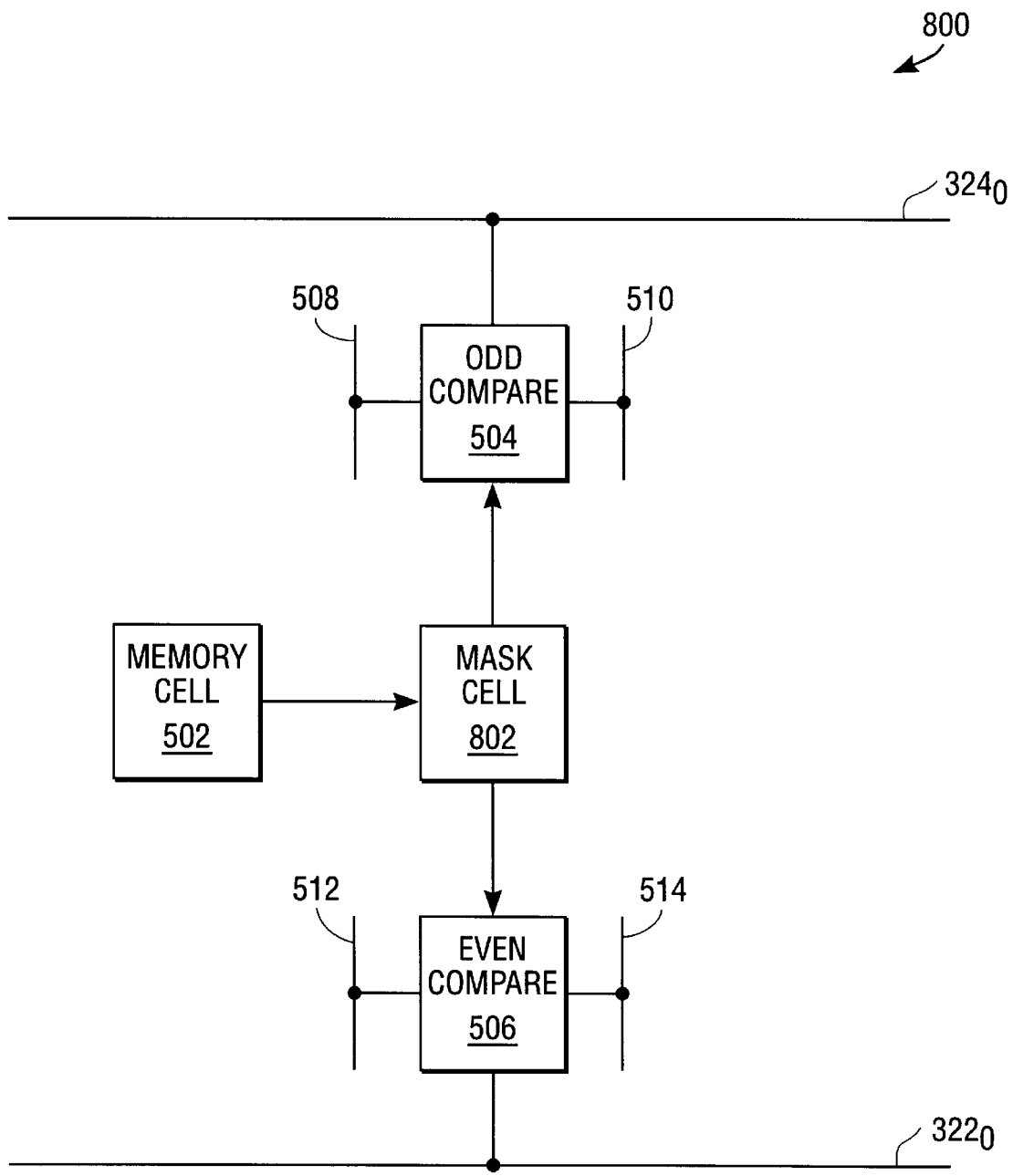
FIG. 8 is another embodiment of ternary CAM cell capable of simultaneously performing multiple compare operations.

FIG. 8 shows ternary CAM cell 800 that is another embodiment of CAM cell 500 of FIG. 5 configured as a ternary CAM cell. CAM cell 800 includes mask cell 802 that masks the data provided from memory cell 502 to compare circuits 504 and 506 when memory cell 800 is masked. When cell 800 is not masked, mask cell 802 provides the data stored in memory cell 502 to compare circuits 504 and 506. For alternative embodiment a separate mask cell may be provided for each compare circuit. Mask cell 802 may be any well-known mask cell that includes, for example, a memory storage element for storing the mask data, and a masking circuit for masking the data provided to compare circuits 504 and 506. Mask data may be loaded into and read from mask cell 802 via a wordline and data bitlines not shown.

Figure 9:
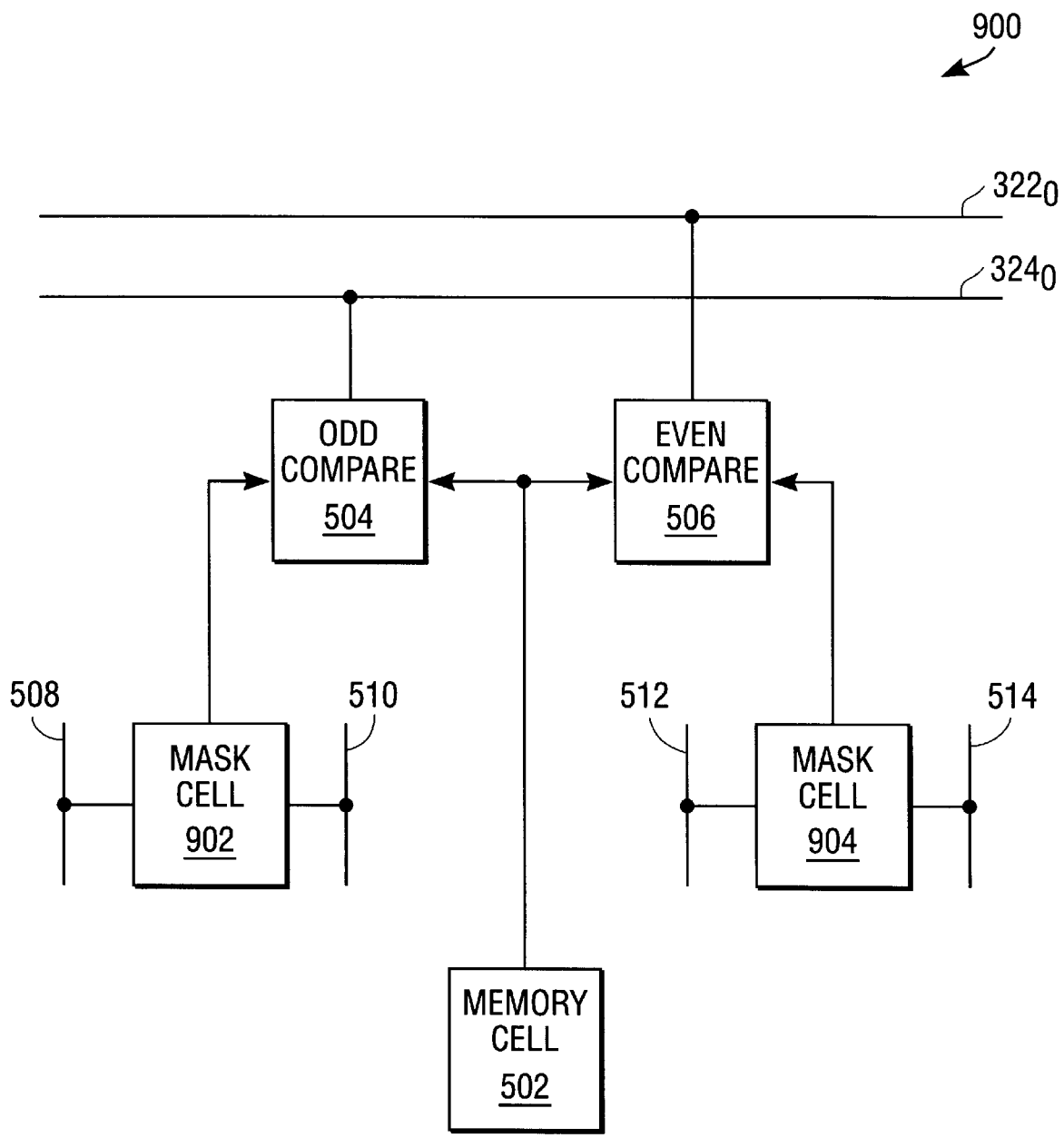
FIG. 9 is another embodiment of ternary CAM cell capable of simultaneously performing multiple compare operations.

FIG. 9 shows ternary CAM cell 900 that is another embodiment of CAM cell 500 of FIG. 5 configured as a ternary CAM cell. CAM cell 900 includes mask cells 902 and 904. Mask cell 902 can mask the odd comparand data provided from odd comparand register 308 to odd compare circuit 504. Mask cell 904 can mask the even comparand data provided from even comparand register 310 to even compare circuit 506. For an alternative embodiment mask cells 902 and 904 may be one mask cell. Mask cells 902 and 904 may be any well-known mask cells that include, for example, a memory storage element for storing the mask data, and a masking circuit for masking the data provided compare circuits 504 and 506. Mask data may be loaded into and read from mask cells 902 and 904 via wordlines and data bitlines not shown.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) cell comprising:
   a memory cell to store data;
   a first compare circuit coupled to a first match line and having a first input coupled to the memory cell and a plurality of second inputs for receiving first comparand data; and
   a second compare circuit coupled to a second match line and having a first input coupled to the memory cell and a plurality of second inputs for receiving second comparand data.

2. The CAM cell of claim 1, further comprising a mask cell coupled between the first compare circuit and the first match line, the mask circuit configured to mask a first comparison by the first compare circuit of the data stored in the memory cell and the first comparand data.

3. The CAM cell of claim 2, wherein the mask cell is further coupled between the second compare circuit and the second match line, the mask circuit configured to mask a second comparison by the second compare circuit of the data stored in the memory cell and the second comparand data.

4. The CAM cell of claim 1, further comprising a mask circuit coupled between the memory cell and the first compare circuit, the mask circuit configured to provide masked data or the data in the memory cell to the first compare circuit for comparison with the first comparand data.

5. The CAM cell of claim 4, wherein the mask circuit is further coupled between the memory cell and the second compare circuit, the mask circuit configured to provide the masked data or the data in the memory cell to the second compare circuit for comparison with the second comparand data.

6. The CAM cell of claim 1, further comprising a first mask circuit coupled between a first compare data line and the first compare circuit, the mask circuit configured to provide first masked data or the first comparand data to the first compare circuit for comparison with the data stored in the memory cell.

7. The CAM cell of claim 6, further comprising a second mask circuit coupled between a second compare data line and the second compare circuit, the second mask circuit configured to provide second masked data or the second comparand data to the second compare circuit for comparison with the data stored in the memory cell.

8. The CAM cell of claim 6, where in the first mask circuit is further coupled between a second compare data line and the second compare circuit, the first mask circuit configured to provide the first masked data or the second comparand data to the second compare circuit for comparison with the data stored in the memory cell.

9. The CAM cell of claim 1, wherein the first and second compare circuits are configured to simultaneously compare the first and second comparand data with the data stored in the memory cell.

10. The CAM cell of claim 1, wherein the first and second compare circuits receive the first and second comparand data from first and second compare data lines, respectively.

11. A content addressable memory (CAM) cell comprising:
 a memory cell for storing data; and
 means for simultaneously comparing first and second comparand data with the data stored in the memory cell and for determining the respective logic states of first and second match lines, wherein the first and second comparand data are independent of each other.

12. The CAM cell of claim 11, further comprising means for masking the comparison of the first and second comparand data with the data stored in the memory cell.

13. A content addressable memory (CAM) device comprising:
 a CAM array having a plurality of CAM cells each coupled to a plurality of match lines;
 a first comparand register for storing first comparand data to be compared with data stored in the CAM array;
 a second comparand register for storing second comparand data to be compared with the data stored in the CAM array.

14. The CAM device of claim 13, further comprising:
 a priority encoder; and
 a multiplexer coupled to the first and second match line of each CAM cell, the multiplexer configured to selectively couple either the first or second match line to the priority encoder.

15. The CAM device of claim 13, further comprising:
 a first priority encoder coupled to the first match line of each CAM cell; and
 a second priority encoder coupled to the second match line of each CAM cell.

16. The CAM device of claim 13, wherein the CAM array is configured to simultaneously compare the first and second comparand data with data stored in the CAM array.

17. The CAM device of claim 13, wherein each CAM cell comprises:
 a memory cell to store the data for the CAM cell;
 a first compare circuit having a first input coupled to the memory cell and a second input coupled to the first comparand register for receiving the first comparand data;
 a second compare circuit having a first input coupled to the memory cell and a second input coupled to the second comparand register for receiving the second comparand data.

18. The CAM device of claim 17, wherein the first and second compare circuits are configured to simultaneously compare the first and second comparand data with the data stored in the memory cell.

19. The CAM device of claim 17, wherein the first and second compare circuits receive the first and second comparand data from first and second compare data lines, respectively.

20. The CAM device of claim 13, wherein the CAM cells comprise ternary CAM cells each having a mask cell.

21. The CAM device of claim 14, further comprising an instruction decoder coupled to the multiplexer.

22. The method of claim 14, further comprising an address decoder coupled to the CAM array.

23. The method of claim 22, wherein the address decoder is further coupled to the priority encoder.

24. A method of determining if first and second comparand data match data stored in a CAM array, comprising:
 simultaneously comparing the first and second comparand data with data stored in a CAM cell of a CAM array, wherein the first and second comparand data are independent of each other; and
 determining the respective logical states of first and second match lines in response to the comparing step.

25. The method of claim 24, further comprising:
 coupling the first match line to a priority encoder for a first period of time; and
 coupling the second match line to the priority encoder for a second period of time.

26. The method of claim 24, further comprising:
 coupling the first match line to a first priority encoder; and
 coupling the second match line to a second priority encoder.

27. The method of claim 24, further comprising masking the comparison of the first and second comparand data with the CAM cell.

28. A content addressable memory (CAM) cell comprising:
 a memory cell to store data;
 a first compare circuit having a first input coupled to the memory cell and a second input for receiving first comparand data;
 a second compare circuit having a first input coupled to the memory cell and a second input for receiving second comparand data, wherein the first and second comparand data are independent of each other; and
 a mask circuit coupled between the memory cell and the first compare circuit.

29. A content addressable memory (CAM) cell comprising:
 a memory cell to store data;
 a first compare circuit having a first input coupled to the memory cell and a second input for receiving first comparand data;
 a second compare circuit having a first input coupled to the memory cell and a second input for receiving second comparand data; and
 a first mask circuit coupled between a first compare data line for carrying the first comparand data and the first compare circuit.

30. A content addressable memory (CAM) cell comprising:
 a memory cell to store data;
 a first compare circuit having a first input coupled to the memory cell and a second input for receiving first comparand data; and
 a second compare circuit having a first input coupled to the memory cell and a second input for receiving second comparand data, wherein the first and second compare circuits are configured to simultaneously compare the first and second comparand data with the data stored in the memory cell, and wherein the first and second comparand data are independent of each other.

31. A content addressable memory (CAM) cell comprising:
- a memory cell to store data;
- a first compare circuit coupled to a first match line and having a first input coupled to the memory cell and a second input for receiving first comparand data to compare with the data of the memory cell; and
- a second compare circuit coupled to a second match line and having a first input coupled to the memory cell and a second input for receiving second comparand data to compare with the data of the memory cell, wherein the first match line and the second match line have different logic states when only one of the first comparand data or the second comparand data matches the data of the memory cell.

32. A content addressable memory (CAM) device comprising:
- a CAM array comprising a plurality of rows of CAM cells each coupled to a corresponding first match line and a second match;
- a first priority encoder coupled to the first match lines of the rows of CAM cells; and
- a second priority encoder coupled to the second match lines of the rows of CAM cells.

33. A content addressable memory (CAM) device comprising:
- a CAM array comprising a plurality of rows of CAM cells each coupled to a corresponding first match line and second match line;
- a priority encoder; and
- a multiplexer coupled to the first and second match lines of each row of CAM cells, the multiplexer configured to selectively couple either the first or second match lines to the priority encoder.

34. A content addressable memory (CAM) cell comprising:
- a memory cell to store data;
- a plurality of compare circuits each coupled to the memory cell; and
- a plurality of match lines each coupled to one of the plurality of compare circuits, wherein the match lines are not coupled to each other.

35. A content addressable memory (CAM) cell comprising:
- a memory cell to store a pair of complementary data bits;
- a first compare circuit having first inputs coupled to the memory cell to receive the pair of complementary data bits, and second inputs for receiving a first pair of complementary comparand data bits; and
- a second compare circuit having first inputs coupled to the memory cell to receive the pair of complementary data bits, and second inputs for receiving a second pair of complementary comparand data bits.

36. The CAM cell of claim 35, further comprising:
- a first match line coupled to the first compare circuit; and
- a second match line coupled to the second compare circuit.

37. The CAM cell of claim 35, further comprising a mask cell coupled to the first compare circuit, the mask circuit configured to mask a first comparison by the first compare circuit of the pair of complementary data bits stored in the memory cell and the first pair of complementary comparand data bits.

38. The CAM cell of claim 35, further comprising a mask cell coupled to the second compare circuit, the mask circuit configured to mask a first comparison by the first compare circuit of the pair of complementary data bits stored in the memory cell and the second pair of complementary comparand data bits.

39. The CAM cell of claim 35, wherein the first and second compare circuits are configured to simultaneously compare the first and second pair of complementary comparand data bits with the pair of complementary data bits stored in the memory cell.

40. The CAM cell of claim 35, further comprising:
- a first pair of compare data lines coupled to the first compare circuit and for carrying the first pair of complementary comparand data bits; and
- a second pair of compare data lines coupled to the second compare circuit and for carrying the second pair of complementary comparand data bits.

* * * * *